(12) United States Patent
Sakawa et al.

(10) Patent No.: US 6,630,794 B2
(45) Date of Patent: Oct. 7, 2003

(54) METHOD FOR DETERMINING AN OPERATIONAL CONDITION OF A THERMAL FIELD ELECTRON EMITTER, A METHOD FOR OPERATING THE THERMAL FIELD ELECTRON EMITTER AND AN ELECTRON BEAM UTILIZING SYSTEM HAVING THE THERMAL FIELD ELECTRON EMITTER

(75) Inventors: Seiichi Sakawa, Gunma (JP); Yoshinori Terui, Gunma (JP)

(73) Assignee: Denki Kagaku Kygyo Kabushiki Kaisha, Tokyo (JP)

( * ) Notice: Subject to any disclaimer, the term of this patent is extended or adjusted under 35 U.S.C. 154(b) by 16 days.

(21) Appl. No.: 09/987,273

(22) Filed: Nov. 14, 2001

(65) Prior Publication Data

US 2002/0060573 A1 May 23, 2002

(30) Foreign Application Priority Data

Nov. 17, 2000 (JP) .................................. 2000-350598

(51) Int. Cl.$^7$ ................................................ G09G 3/10
(52) U.S. Cl. ................. 315/169.1; 315/169.3; 313/309
(58) Field of Search ................... 315/169.1, 169.3, 315/326, 336; 313/306, 309, 310, 495; G09G 3/10

(56) References Cited

U.S. PATENT DOCUMENTS

| | | | | |
|---|---|---|---|---|
| 4,588,928 A | * | 5/1986 | Liu et al. | 315/382 |
| 5,177,402 A | * | 1/1993 | Howard et al. | 315/1 |
| 5,584,739 A | * | 12/1996 | Itoh et al. | 445/24 |
| 5,838,096 A | * | 11/1998 | Shinada et al. | 313/336 |
| 6,211,518 B1 | * | 4/2001 | Richardson et al. | 250/310 |
| 6,246,190 B1 | * | 6/2001 | Prior | 315/382 |

OTHER PUBLICATIONS

Hiroshi Adachi, "Approach to a Stable Field Emission Electron Source", Shinku, vol. 29, No. 1, 1986, pp. 13–25.
L. W. Swanson, et al., "Field Electron Cathode Stability Studies: Zirconium/Tungsten Thermal–Field Cathode" Journal of Applied Physics, vol. 46, No. 5, May 1975, pp. 2029–2050.

* cited by examiner

*Primary Examiner*—Tho Phan
(74) *Attorney, Agent, or Firm*—Oblon, Spivak, McClelland, Maier & Neustadt, P.C.

(57) ABSTRACT

An S/N ratio of a probe current is measured while a filament current is changed, and the filament current in which the S/N ratio is maximal is determined.

6 Claims, 2 Drawing Sheets

RELATION BETWEEN FILAMENT CURRENT VALUE
AND S/N RATIO OF PROBE CURRENT

METHOD FOR DETERMINING AN OPERATIONAL CONDITION OF A THERMAL FIELD ELECTRON EMITTER, A METHOD FOR OPERATING THE THERMAL FIELD ELECTRON EMITTER AND AN ELECTRON BEAM UTILIZING SYSTEM HAVING THE THERMAL FIELD ELECTRON EMITTER

BACKGROUND OF THE INVENTION

1. Field of the Invention

The present invention relates to a method for determining an operational condition of a thermal field electron emitter used as an electron source for an electron microscope, an electron beam lithography system, an electron beam tester, a wafer inspection equipment, an Auger electron spectrograph or the like; a method for operating the thermal field electron emitter, and an electron beam utilizing system having the thermal field electron emitter.

2. Discussion of the Background

In recent years, in order to obtain electron beams of higher brightness, there has been used a thermal field electron emitter using a needle electrode of single crystal tungsten. This thermal field electron emitter is so constructed that a coating layer composed of zirconium and oxygen (hereinbelow, referred to as the ZrO coating layer) is formed on a single crystal tungsten needle having an axis direction of <100> so that the work function of a (100) face of the single crystal tungsten is reduced from 4.5 eV to about 2.8 eV by the effect of the ZrO coating layer. The thermal field electron emitter has features of providing electron beams of high brightness, because only the fine crystal face corresponding to the (100) face formed on a tip of needle constitutes an electron emission region, and a long life in comparison with a conventional thermionic electron emitter. Further, it has features of being stable, operable in a bad vacuum condition and easy to use in comparison with a cold field electron emitter.

Although the proposed thermal field electron emitter has the above-mentioned advantages, it has such a drawback that a low frequency component of noise is large. An emission current contains a flicker noise (1/f noise) of about 0.23% in a range of 1 Hz–5000 Hz. However, it is known that the probe current contains a current variation of higher level than the flicker noise in a low frequency region and the low frequency component varies depending on temperature, electrostatic field strength and the shape of the cathode (see, Shinku, Vol. 29, No.1 (1986) 13–25).

Tip temperature is an important parameter in determining an actual operational condition of the thermal field electron emitter. Generally, a tip is heated by Joule heat by feeding a direct current to the tungsten filament which is welded with a tip. Therefore tip temperature is controlled by filament current. For example, there is description that the optimum working temperature of the above-mentioned ZrO-coated tungsten thermal field electron emitter is 1800 K (see J. Applied Physics., 46, 5 (1975) 2029–2050). In a generally used method according to such information, the filament current is determined so as to correspond to a tip temperature of 1800 K. However, even in a single thermal field electron emitter, the heat dissipation varies depending on an electrode structure mounted, and accordingly, there appears a change of a set value of filament current which is used in order to obtain a predetermined tip temperature. The tip temperature can be measured with an optical pyrometer.

However, in some cases, an electron beam utilizing system having no window for observing a tip temperature is used. Such electron beam utilizing system may not be able to detect an actual temperature. Further, even when an adjustment of 1800K is made, there is no evidence as to whether or not the thermal field electron emitter is at an operational temperature capable of obtaining a stable electron emission with little current fluctuation, because a large variety of heat dissipation takes place depending on an electrode structure used. As means for confirming the stability of electron beams, there is a method for detecting probe current drift when electrons emit continuously for a long term. However, the method has such problems that it takes much time, e.g., several tens hours for confirmation and it is not always successful by only one time of adjustment. Here, the probe current means an axial current.

SUMMARY OF THE INVENTION

It is an object of the present invention to provide a method for determining, in a short time, an appropriate operational condition of a thermal field electron emitter so that it can emit electrons stably.

It is an object of the present invention to provide a method for operating the thermal field electron emitter.

Further, it is an object of the present invention to provide an electron beam utilizing system having the thermal field electron emitter, which can improve operating availability of the thermal field electron emitter.

In accordance with the present invention, there is provided a method for determining an operational condition of a thermal field electron emitter, which comprises measuring an S/N ratio of a probe current while a filament current is changed, and determining the filament current in which the S/N ratio is maximal.

Further, in accordance with the present invention, there is provided a method for operating a thermal field electron emitter characterized in that the thermal field electron emitter is operated under the condition that the S/N ratio of a probe current is measured while a filament current is changed, and the filament current in which the S/N ratio is maximal is maintained.

In the above-mentioned methods, the thermal field electron emitter comprises a needle of single crystal tungsten having an axis direction of <100> on which a coating layer composed of zirconium and oxygen is formed.

In accordance with the present invention, there is provided an electron beam utilizing system for determining an operational condition of a thermal field electron emitter, which comprises a thermal field electron emitter, a control electrode, an extractor, an electrode for receiving a probe current of electron beams which pass through the extractor, and a spectrum analyzer for measuring an S/N ratio of the probe current wherein the S/N ratio is measured by the spectrum analyzer while a filament current is changed, to determine the filament current in which the S/N ratio is maximal.

In the above-mentioned system, the thermal field electron emitter comprises a needle of single crystal tungsten having an axis direction of <100> on which a coating layer composed of zirconium and oxygen is formed.

BRIEF DESCRIPTION OF THE DRAWINGS

In drawing.

DESCRIPTION OF THE PREFERRED EMBODIMENTS

Preferred embodiments of the present invention will be described in detail.

The inventors of this application have made extensive studies in view of the circumstances of conventional techniques. As a result, they have obtained a new knowledge that when a filament current and an extractor voltage are changed, an S/N ratio resulted from a probe current of the thermal field electron emitter has temperature dependence, and the S/N ratio assumes the maximum value at a specified tip temperature (i.e., a specified filament current value). Further, they have obtained a knowledge that when a thermal field electron emitter is operated by determining the filament current value so that the S/N ratio is maximal, it is possible to obtain a stable electron emission with a little current fluctuation. Thus, the present invention has been achieved.

As described above, the present invention is made based on the knowledge that an S/N ratio resulted from a probe current of the thermal field electron emitter has temperature dependence, and the S/N ratio assumes the maximum value at a specified tip temperature (i.e., a specified filament current value).

Figure 1:
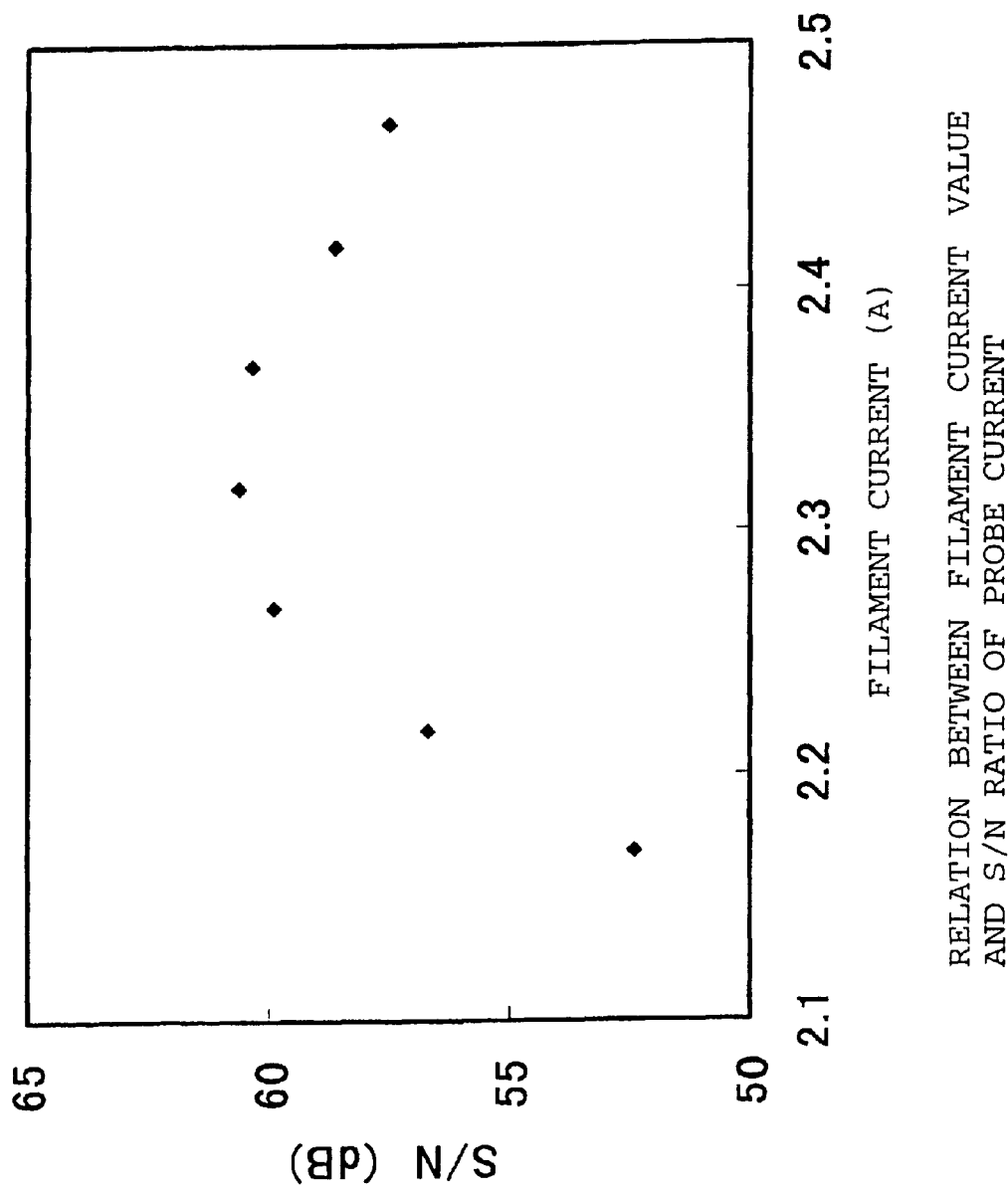
FIG. 1 is a diagram showing the relation between the filament current value and the S/N ratio of the probe current.

FIG. 1 is a part of data as a result of the studies by the inventors. It is understood that when the filament current and the extractor voltage are changed so as to obtain a predetermined angular intensity, an S/N ratio resulted from a probe current has temperature dependence, and it assumes the maximum value at a specified filament current value.

In a generally used thermal field electron emitter, in bad vacuum condition, molecules of adsorbed gas move on the surface of the emitter to increase noise. Accordingly, it is necessary to maintain pressure to a certain level or lower. However, when the tip temperature is low, gas desorption might be difficult, and noise increases by the same reason. The mechanism causing an increase of noise in a region of high tip temperature is not clear.

Based on the above-mentioned knowledges, the inventors have completed the present invention by finding that the filament current value, by which the thermal field electron emitter is operated with a little current fluctuation at a predetermined angular intensity, can be determined in a relatively short time by measuring noise. Namely, an operational condition of the thermal field electron emitter can be determined by only determining the filament current value indicating the maximum value by measuring noise. According to the present invention, the filament current value can be optimized in view of the S/N ratio. Accordingly, it is unnecessary to detect the tip temperature; it is unnecessary to conduct temperature measurement with an optical pyrometer, and it is possible to obtain the optimized condition even with an apparatus without having a window for detecting temperature.

Further, the inventors have completed the present invention by finding that in operating the thermal field electron emitter under the operational condition as determined in the above-mentioned method, the emitter can be operated under the same operational condition as the conventional method in a very short time in comparison with the conventional method. Namely, According to the present invention, operations for determining the operational condition of the thermal field electron emitter, which took several tens hours in the conventional method, can be done in only about 2 to 3 hours, whereby operating availability of an electron beam utilizing system having a thermal field electron emitter can extremely be improved.

Further, the inventors have completed the invention concerning the electron beam utilizing system having a thermal field electron emitter in which the above-mentioned method for determining the operational condition is previously incorporated. With the electron beam utilizing system, a stable operational condition can be determined easily at each time of maintenance such as exchanging of parts, for a high resolution electron microscope, an electron beam tester or a wafer inspection equipment in which there is a sever requirement of feeding a stable probe current. The operational condition can be done even when there is a scattering in structure of the cathode itself or a slight deviation of an electrode part in exchanging or mounting operation.

In the system, it is in particular effective to use the thermal field electron emitter comprising a needle of single crystal tungsten having an axis direction of <100> on which a coating layer composed of zirconium and oxygen is formed.

EXAMPLE

A thermal field electron emitter used for an electron microscope, as an important part of the electron beam utilizing system of the present invention, was prepared by the following procedure.

A tungsten wire, as filaments, was fixed by welding to metal supports on an insulator and then, a single crystal tungsten needle was fixed by welding to the tungsten wire. A front end of the single crystal tungsten needle was subjected to electropolishing to form a sharp end, and the needle was heated at about 1500° C. Thus, the thermal field electron emitter on which a coating layer composed of zirconium and oxygen is formed was produced. A suppressor electrode as a control electrode was fixed integrally to the thermal field electron emitter by a screw to prepare a thermal field emission electron gun.

Figure 2:
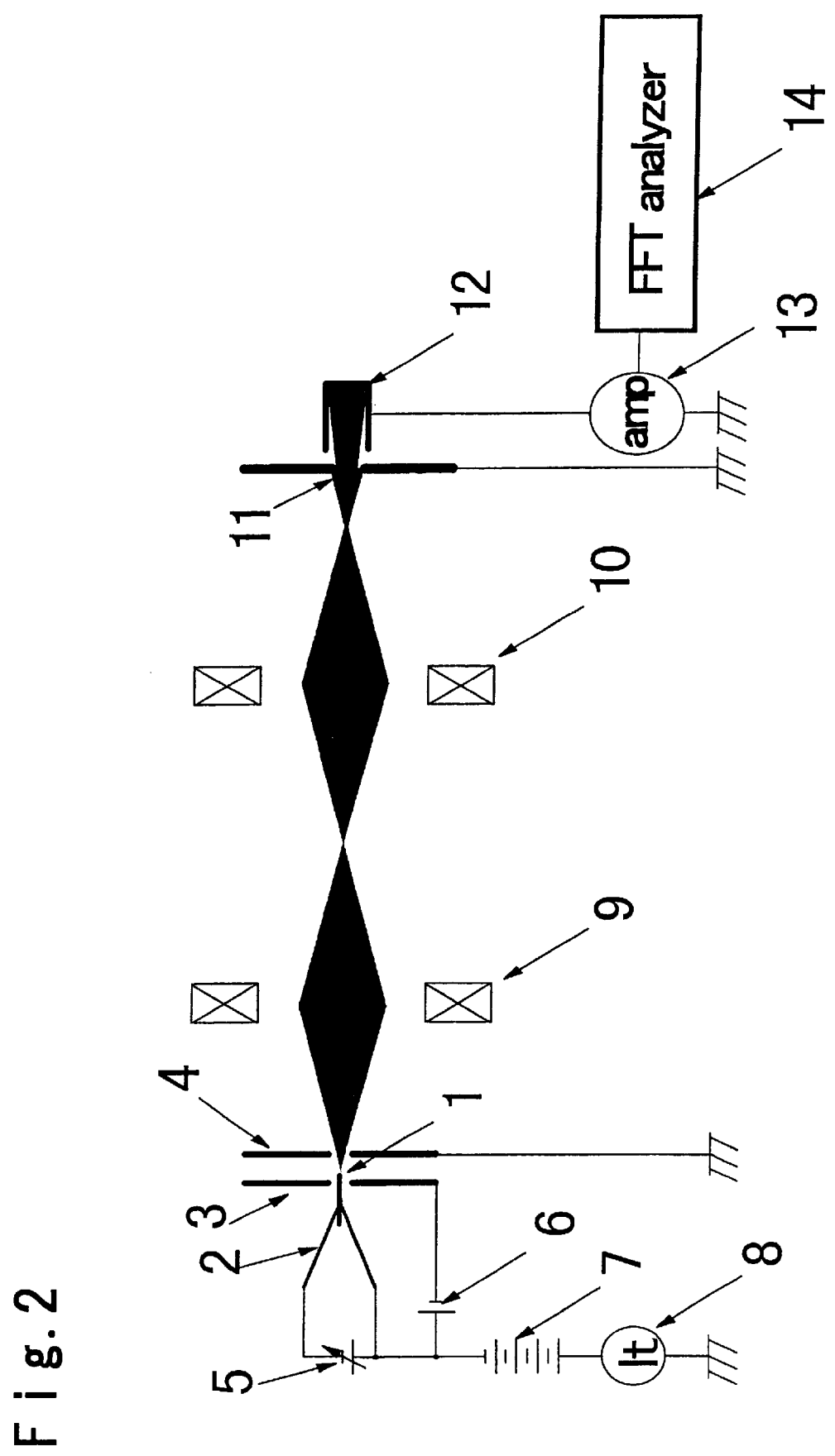
FIG. 2 is a diagram of an embodiment of the electron beam utilizing system in which an S/N ratio of a probe current is measured.

FIG. 2 shows diagrammatically an embodiment of the electron beam utilizing system comprising an electron beam emission part and an S/N ratio measuring part according to the present invention, which can be utilized for an electron microscope.

A thermal field electron emitter comprising a needle 1 and filaments 2 is heated by feeding an electric current from a heating source 5. A voltage is applied to an extractor 4 to form an electric field on a tip of the needle to thereby cause electron emission. A negative voltage is applied from a bias power source 6 to a suppressor electrode 3 as a control electrode in order to cut the electric current emitted from the part other than the tip of the needle 1. Emitted electrons are converged by means of a condenser lens 9 and an objective lens 10, and only electrons passing through an aperture 11 formed in a central portion of a sampling table 11 are received, as a probe current, by a cup-like electrode 12. The cup-like electrode 12 is connected to an FFT analyzer 14 as a spectrum analyzer via a current amplifier for amplifying the electric current and converting the current into a voltage. The measurement of the S/N ratio of the probe current is carried out in the FFT analyzer 14.

Measurement of S/N Ratio

The measurement of the S/N ratio was conducted under a vacuum of $5\times10^{-8}$ Pa. The filament current was gradually raised from 2.0 A to 2.5 A, and each time of the raising, the extractor voltage was adjusted so that the angular intensity became finally 250 µA/sr. A bias voltage of 500 V was applied to the suppressor electrode.

The measurement of the S/N ratio was conducted as follows. A probe current received by a cup-like electrode was supplied to a current amplifier (manufactured by Keithley), and the amplified current was converted into a power spectrum by an FFT analyzer (manufactured by Kikusui Denshi Kogyo K.K.). As conditions for the measurement, the obtained power spectrum was converted into an S/N ratio wherein a frequency range for analysis was 1 kHz (Full time: 200 ms and sampling: 512 points); the overall value was to be a signal intensity, and an effective value at a band width of 300 Hz (100–400 Hz) was to be a noise quantity.

FIG. 1 shows the S/N ratio of the probe current at the time of determining each filament current. By conducting a curve approximation method on the graph or by using a personal computer, the maximum value was calculated. As a result, the filament current was 2.34 A. In this case, the tip temperature was measured with an optical pyrometer to find 1772 K. The time needed for the optimization was about 2 hours.

Another method for obtaining the maximum value of the S/N ratio will be described. In determining the condition of the filament current, two points of value: a lower value (e.g., 2.0 A) and a higher value (e.g., 2.5 A) are selected, and each S/N ratio is measured by the above-mentioned method. Further, a middle point of value between the lower value and the higher value is selected, and the S/N ratio is measured by the same method. In the three measured points of value, two points having a higher S/N ratio are selected, and the S/N ratio at the middle point of the two selected points is measured. By repeating such operations, the filament current having the maximum S/N ratio can be obtained. According to this procedure, the optimized filament current can be obtained by a manual operation. Further, an automatic operation can be conducted by combining, for instance, an AD converter, a personal computer and a DA converter.

According to the present invention, a noiseless operational condition can be obtained in a short time, and stable electron emission can easily be maintained for a long term. In particular, even in a system of a type that the tip temperature can not be detected, a noiseless operational condition can be obtained in a short time by controlling the filament current value without the necessity of detecting the tip temperature. The present invention is very useful in industry.

The entire disclosure of Japanese Patent Application No. 2000-350598 filed on Nov. 17, 2000 including specification, claims, drawings and summary are incorporated herein by reference in its entirety.

What is claimed is:

1. A method for determining an operational condition of a thermal field electron emitter, comprising:

measuring an S/N ratio of a probe current while a filament current is charged; and determining the filament current in which the S/N ratio is maximal.

2. The method according to claim 1, wherein the thermal field electron emitter comprises a needle of single crystal tungsten having an axis direction of <100> on which a coating layer composed of zirconium and oxygen is formed.

3. The method of operating a thermal field electron emitter, comprising:

measuring an S/N ratio of a probe current while a filament current is charged; and maintaining the filament current in which the S/N ratio is maximal.

4. The method according to claim 3, wherein the thermal field electron emitter comprises a needle of single crystal tungsten having an axis direction of <100> on which a coating layer composed of zirconium and oxygen is formed.

5. An electron beam utilizing system for determining an operational condition of a thermal field electron emitter, comprising:

a thermal field electron emitter;

a control electrode;

an extractor;

an electrode for receiving a probe current of electron beams which pass through the extractor; and a spectrum analyzer for measuring an S/N ratio of the probe current,
wherein the S/N ratio is measured by the spectrum analyzer while a filament current is changed, to determine the filament current in which the S/N ratio is maximal.

6. The electron beam utilizing system according to claim 5, wherein the thermal field electron emitter comprises a needle of single crystal tungsten having an axis direction of <100> on which a coating layer composed of zirconium and oxygen is formed.

* * * * *

UNITED STATES PATENT AND TRADEMARK OFFICE
CERTIFICATE OF CORRECTION

PATENT NO. : 6,630,794 B2
DATED : October 7, 2003
INVENTOR(S) : Sakawa et al.

It is certified that error appears in the above-identified patent and that said Letters Patent is hereby corrected as shown below:

<u>Title page,</u>
Item [73], Assignee, should read:

-- [73] Assignee: Denki Kagaku Kogyo Kabushiki Kaisha, Tokyo (JP) --

Signed and Sealed this

Sixth Day of January, 2004

JAMES E. ROGAN
*Director of the United States Patent and Trademark Office*